(12) United States Patent
Dong et al.

(10) Patent No.: US 11,264,551 B2
(45) Date of Patent: Mar. 1, 2022

(54) DISPLAY PANEL, DISPLAY DEVICE AND METHOD FOR MANUFACTURING DISPLAY PANEL

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Xiangdan Dong, Beijing (CN); Youngyik Ko, Beijing (CN); Ming Hu, Beijing (CN)

(73) Assignees: Chengdu BOE Optoelectronics Technology Co., Ltd., Sichuan (CN); BOE Technology Group Co., Ltd., Beijing (CN)

( * ) Notice: Subject to any disclaimer, the term of this patent is extended or adjusted under 35 U.S.C. 154(b) by 295 days.

(21) Appl. No.: 16/611,091

(22) PCT Filed: Jan. 12, 2018

(86) PCT No.: PCT/CN2018/072480
§ 371 (c)(1),
(2) Date: Nov. 5, 2019

(87) PCT Pub. No.: WO2018/218971
PCT Pub. Date: Dec. 6, 2018

(65) Prior Publication Data
US 2020/0152844 A1    May 14, 2020

(30) Foreign Application Priority Data

May 27, 2017    (CN) .......................... 201710392688.6

(51) Int. Cl.
*H01L 33/62*    (2010.01)
*G06F 1/16*    (2006.01)
(Continued)

(52) U.S. Cl.
CPC ............ *H01L 33/62* (2013.01); *G06F 1/1652* (2013.01); *H01L 25/0753* (2013.01); *H01L 33/0095* (2013.01); *H01L 2933/0066* (2013.01)

(58) Field of Classification Search
CPC ....................................................... H01L 33/62
See application file for complete search history.

(56) References Cited

U.S. PATENT DOCUMENTS

2020/0243452 A1*   7/2020   Lim .................... H01L 23/5387

FOREIGN PATENT DOCUMENTS

| CN | 102736349 A | 10/2012 |
|---|---|---|
| CN | 104133307 A | 11/2014 |

(Continued)

OTHER PUBLICATIONS

Lim et al., WO 2019088563A1, published May 9, 2019.*

(Continued)

*Primary Examiner* — Suberr L Chi
(74) *Attorney, Agent, or Firm* — The Webb Law Firm

(57) ABSTRACT

The present disclosure relates to display panel, display device and method for manufacturing display panel. A display panel is provided that comprises: a display substrate having a first surface and a second surface opposite to the first surface, the display substrate having a display area and a non-display area, the non-display area including at least a first portion and a second portion located on two opposite sides of the display area; a first connection terminal located at the first portion and located on the first surface; a first connection hole located at the first portion, the first connection hole at least penetrating the display substrate; a second connection terminal located at the second portion and located on the first surface; a second connection hole located at the second portion, and the second connection hole at least penetrating the display substrate; a chip on film (COF)

(Continued)

located on a second surface of the display substrate, the chip on film including third connection terminals; and conductive materials respectively disposed in the first connection hole and the second connection hole; wherein the first connection terminal and the second connection terminal of the display substrate are electrically connected to the respective third connection terminals through the conductive materials located in the first connection hole and the second connection hole, respectively; and wherein orthographic projections of the first connection hole and the second connection hole on the display substrate is located within an orthographic projection of an outer edge of the chip on film on the display substrate.

20 Claims, 8 Drawing Sheets

(51) Int. Cl.
    *H01L 25/075*    (2006.01)
    *H01L 33/00*    (2010.01)

(56) References Cited

FOREIGN PATENT DOCUMENTS

| | | |
|---|---|---|
| CN | 106444183 A | 2/2017 |
| CN | 106973520 A | 7/2017 |
| CN | 107037647 A | 8/2017 |
| CN | 107039377 A | 8/2017 |
| CN | 107093606 A | 8/2017 |
| JP | 2002-116454 A | 4/2002 |
| JP | 2008-275894 A | 11/2008 |
| KR | 20070010288 A | 1/2007 |

OTHER PUBLICATIONS

First Office Action for CN Appl. No. 201710392688.6, dated Mar. 15, 2019, 17 pages with English language translation.
International Search Report and Written Opinion on PCT/CN2018/ 072480, dated Apr. 19, 2018, 20 pages with English language translation.

* cited by examiner

DISPLAY PANEL, DISPLAY DEVICE AND METHOD FOR MANUFACTURING DISPLAY PANEL

CROSS-REFERENCE TO RELATED APPLICATIONS

The present application is a U.S. National Stage Application under 35 U.S.C. § 371 of International Patent Application No. PCT/CN2018/072480, filed on Jan. 12, 2018, which claims priority to the Chinese Application No. 201710392688.6 filed on May 27, 2017, the entire disclosures of each of which are incorporated herein by reference.

TECHNICAL FIELD

The present disclosure relates to the field of display technologies, and in particular, to a display panel, a display device, and a method of manufacturing the display panel.

BACKGROUND

With the continuous development of display technology, display panels are increasingly used in display products. Display products with narrow bezels (e.g., cell phones (especially full-screen phones) or wearable devices (e.g., smart watches)) attract a large number of consumers because they enable users to have a better viewing experience.

Currently, pad bending process is the only solution for implementing a display panel with a narrow bezel. However, the display panel manufactured by the pad bending process has many problems, and there may be a display failure phenomenon caused by cracks in the inorganic insulating layer. In addition, the conventional pad bending technology also increases process difficulty and manufacturing cost, and production efficiency is low. In addition, the formation of the pad bending region P requires increased space, and the display product produced by the pad bending process has a low utilization ratio of the substrate.

On the other hand, high-resolution (high PPI) display panels have gradually become a developing trend of the display industry because of their good visual effects. However, the higher the resolution is, the more connection terminals (also simply referred to as terminals) that are required to be set in the display panel. In such a case, it becomes a challenge to achieve a narrower bezel design.

Therefore, there is a need for a display product having a high resolution and having a narrow bezel and a method for manufacturing the same.

SUMMARY

In view of these, embodiments of the present disclosure provide a display panel, a display device, and a method of manufacturing the display panel.

According to an aspect of present disclosure, there is provided a display panel comprising: a display substrate having a first surface and a second surface opposite to the first surface, the display substrate having a display area and a non-display area, the non-display area including at least a first portion and a second portion located on two opposite sides of the display area; a first connection terminal located at the first portion and located on the first surface; a first connection hole located at the first portion, the first connection hole at least penetrating the display substrate; a second connection terminal located at the second portion and located on the first surface; a second connection hole located at the second portion, and the second connection hole at least penetrating the display substrate; a chip on film (COF) located on a second surface of the display substrate, the chip on film including third connection terminals; and conductive materials respectively disposed in the first connection hole and the second connection hole; wherein the first connection terminal and the second connection terminal of the display substrate are electrically connected to the respective third connection terminals through the conductive materials located in the first connection hole and the second connection hole, respectively; and wherein orthographic projections of the first connection hole and the second connection hole on the display substrate is located within an orthographic projection of an outer edge of the chip on film on the display substrate.

In some embodiments, the display panel may further comprises: a bonding layer disposed between the chip on film and the second surface of the display substrate.

In some embodiments, at least one of the first connection hole and the second connection hole and the conductive material corresponding to the at least one connection hole penetrate the display substrate and the bonding layer; and wherein the third connection terminal corresponding to the at least one connection hole is disposed on a side of the chip on film which faces the display substrate.

In some embodiments, at least one of the first connection hole and the second connection hole and the conductive material corresponding to the at least one connection hole penetrate the display substrate, the bonding a layer and the chip on film; and wherein the third connection terminal corresponding to the at least one connection hole is disposed on a side of the chip on film which faces away from the display substrate.

In some embodiments, the first connection terminal is electrically connected to a first wiring in the display area of the display substrate, and the second connection terminal is electrically connected to a second wiring in the display area of the display substrate, and the first wiring and the second wiring are alternately arranged.

In some embodiments, the first connection holes are in one-to-one correspondence with the first connection terminals, the second connection holes are in one-to-one correspondence with the second connection terminal, and the sizes of the first connection terminals and the second connection terminals are larger than the apertures of the respective connection holes.

In some embodiments, the first connection hole and the second connection hole have a diameter greater than or equal to 25 m; and orthographic projections of the first connection terminal and the second connection terminal on the display substrate cover orthographic projections of respective connection holes on the display substrate.

In some embodiments, the first connection terminal or the second connection terminal is adapted to function as one or more of the following: a clock connection terminal, a data connection terminal, a high level connection terminal, a low level connection terminal.

In some embodiments, the display panel may further comprises: an integrated circuit chip on a side of the chip on film facing away from the display substrate; and a flexible circuit board bonded to the chip on film on a side of the chip on film which faces away from the display substrate.

In some embodiments, the display substrate is a flexible display substrate.

According to another aspect of present disclosure, there is provided a display device comprising the display panel according to any embodiment as above or as described below.

According to an aspect of present disclosure, there is provided a method of manufacturing a display panel, comprising: providing a display substrate having a first surface and a second surface opposite to the first surface, the display substrate having a display area and a non-display area, the non-display area including at least a first portion and a second portion on opposite sides of the display area, a first connection terminal formed at the first portion of the non-display area and on the first surface, and a second connection terminal formed at the second portion of the non-display area and on the first surface; providing a chip on film assembly on the display substrate, the chip on film assembly comprising a chip on film, wherein the chip on film is bonded to a second surface of the display substrate, the chip on film having a third connection terminal; forming a first connection hole in the first portion of the non-display area, the first connection hole at least penetrating the display substrate; forming a second connection hole in the second portion of the non-display area, the second connection hole extending at least through the display substrate; forming a conductive material in the first connection hole and the second connection hole, wherein the first connection terminal and the second connection terminal are respectively electrically connected to corresponding third connection terminals of the chip on film via respective conductive material, and wherein the first connection hole and the second connection hole are configured such that orthographic projections thereof on the display substrate are within an orthographic projection of an outer edge of the chip on film on the display substrate.

In some embodiments, providing the chip on film assembly on the display substrate comprises: bonding the chip on film to the second surface of the display substrate with a bonding layer.

In some embodiments, at least one of the first connection hole and the second connection hole is formed to penetrate the display substrate and the bonding layer, the conductive material corresponding to the at least one connection hole is also formed to penetrate the display substrate and the bonding layer, and the third connection terminal corresponding to the at least one connection hole is disposed on a side of the chip on film which faces the display substrate.

In some embodiments, at least one of the first connection hole and the second connection hole is formed to penetrate through the display substrate, the bonding layer, and the chip on film, the conductive material corresponding to the at least one connection hole penetrates the display substrate, the bonding layer, and the chip on film, and the third connection terminal corresponding to the at least one connection hole is disposed on a side of the chip on film which faces away from the display substrate.

In some embodiments, the first connection holes are in one-to-one correspondence with the first connection terminals, the second connection holes are in one-to-one correspondence with the second connection terminals, and an orthographic projection of each of the first and second connection terminals on the display substrate covers the corresponding connection hole.

In some embodiments, forming the first connection hole and forming the the second connection hole are performed by a laser drilling process.

In some embodiments, the method further comprises: bonding a flexible circuit board to the chip on film on a side of the chip on film which is provided with the integrated circuit chip.

In some embodiments, the chip on film assembly further comprises an integrated circuit chip disposed on a side of the chip on film which faces away from the display substrate.

In some embodiments, after the chip on film assembly is disposed on the display substrate, forming the first connection hole and the forming the second connection hole are performed; and forming of the conductive material in the first connection hole and the second connection hole is performed after the first connection hole and the second connection hole are formed.

Other features and advantages of the present disclosure will become apparent from the following detailed description of the illustrative embodiments of the present disclosure with reference to the drawings.

BRIEF DESCRIPTION OF THE DRAWINGS

The drawings that constitute a part of the specification describe exemplary embodiments of the present disclosure, and together with the description are intended to explain the principles of the present disclosure.

Figure 1:
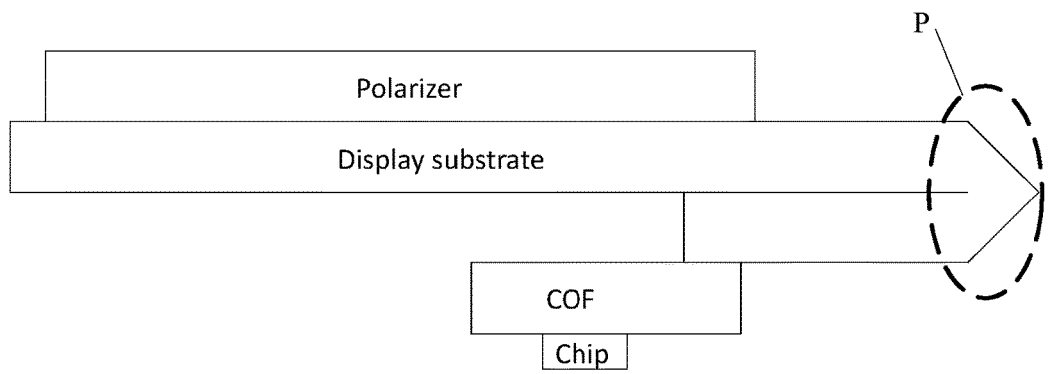
FIG. 1 is a schematic structural view of a conventional display panel.

Note that, in the embodiments described below, the same reference numerals are sometimes used to refer to the same parts or parts having the same functions in the drawings, and the repeated description thereof will be omitted. In the present specification, similar reference numerals and letters are used to indicate similar items, and therefore, once an item is defined in one drawing, it may be not necessarily further discussed in the subsequent drawings.

DETAILED DESCRIPTION OF EXEMPLARY EMBODIMENTS

Hereinafter, embodiments of the inventions disclosed in the present specification will be described in detail with reference to the accompanying drawings. It should be understood, however, that the descriptions of the various embodiments are merely illustrative and are not intended to limit the inventions to be claimed. The relative arrangement of the components and the steps, the expressions, the numerical values, and the like in the exemplary embodiments are not intended to limit the inventions to be claimed, unless specifically stated otherwise or the principles thereof state otherwise expressly or implicitly. In the present specification, those techniques, methods, devices and the like that are known to those of ordinary skill in the art may be not discussed in detail, but the techniques, methods, devices and the like should be considered as parts of the specification when needed.

The terms as used herein are used for the purpose of describing the particular embodiments, and are not intended to limit the present disclosure. It is to be understood that when the terms "comprise" or "include" or their variants are used in the specification, it indicates that the related features, wholes, steps, operations, units and/or components are present, but it does exclude the presence or addition of one or more other features, wholes, steps, operations, units and/or components and/or combinations thereof.

As used herein, the term "connect" or its variants means that one element/node/feature may be mechanically, electrically, logically or in other manner with another element/node/feature directly or indirectly to allow interaction, unless explicitly stated otherwise. That is, "connect" or its variants is intended to include both direct and indirect connections of the elements or other features, including the connection with use of one or more intermediate elements.

In the present disclosure, terms such as "first", "second", "third", etc. are used to avoid confusion of constituent elements, and are not intended to indicate any order of priority in any aspect.

It will be understood that various films/layers in the drawings are shown for illustrative purposes only, and their sizes and shapes do not indicate their actual sizes and shapes thereof.

FIG. 1 is a schematic view showing a structure of a display panel prepared by a conventional terminal bending technique. As shown in FIG. 1, a terminal portion of the substrate is bent to achieve a reduced bezel (as compared to the case where it is not bent). The bending also causes the terminals (not shown) on the substrate to face the chip on film (COF) for electrical connection. However, in the terminal bending region P, the inorganic insulating layer may crack, resulting in display failure. Conventionally, the inorganic insulating layer in the connection terminal bending portion P is removed by adding a mask process; and then an organic insulating layer is formed in the connection terminal bending portion P by adding another mask process; thus, the display failure caused by cracks in the inorganic insulating layer of the terminal bending region P in the bending process can be avoid. Although this avoids the display failure phenomenon caused by the crack of the inorganic insulating layer to some extent, two mask processes are added, which increases the process difficulty and the manufacturing cost, and reduces the production efficiency. Further, the formation of the connection terminal bending portion P requires an increase in space, and the display product produced by the connection terminal bending process has a low utilization ratio of the base substrate.

On the other hand, high-resolution (in PPI) display panels have gradually become a developing trend in the display industry because of their good visual effects. However, the higher the resolution is, the more wirings (such as power lines, ground lines, various signal lines, etc.) and corresponding connection terminals (also referred to as terminals) that are required to be set in the display panel are required. This may be detrimental to the implementation of a narrow bezel. At higher resolution, achieving a narrower bezel design becomes a challenge.

Figure 2A:
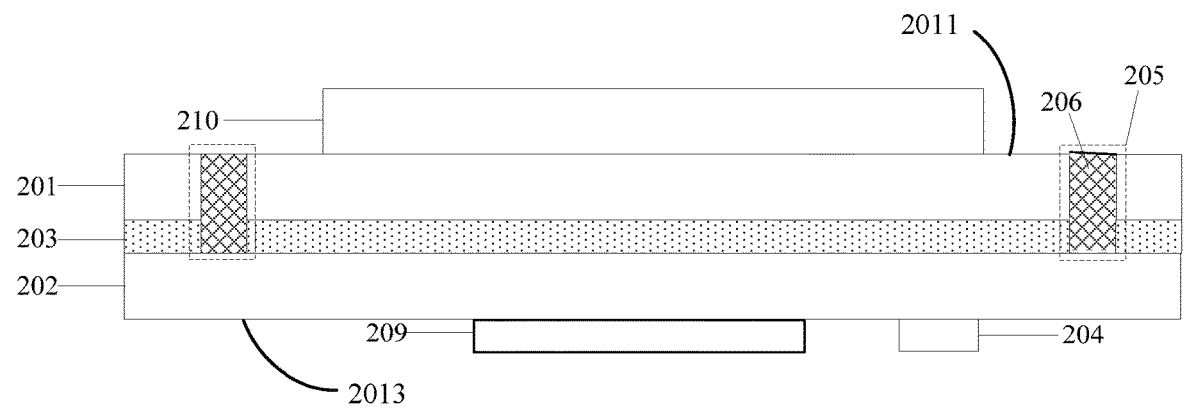
FIGS. 2a to 2h are schematic structural views of display panels according to embodiments of the present disclosure.
Figure 2B:
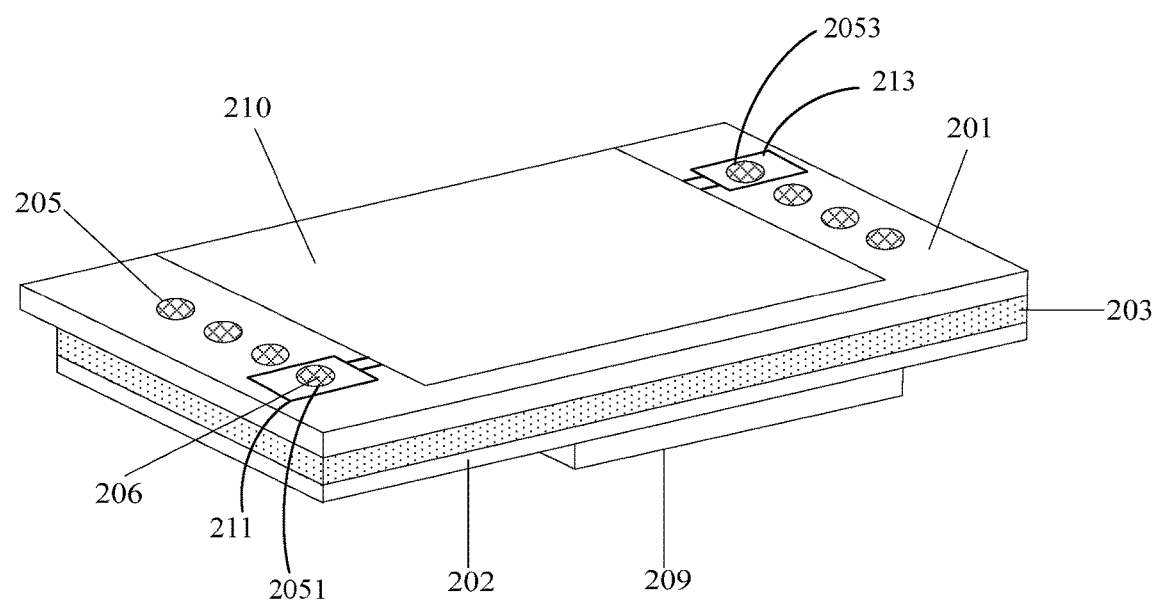

FIGS. 2a through 2h illustrate structural diagrams of display panels in accordance with some embodiments of the present disclosure. As shown in FIGS. 2a and 2b, the display panel 200 includes a display substrate 201. The display substrate 201 has a first surface 2011 and a second surface 2013 opposite to the first surface. The display substrate 201 may have a display area 2015 (see FIG. 4b) and a non-display area (e.g., an edge portion of the display panel outside the display area 2015). Therefore, the first surface 2011 may sometimes be referred to as a display surface. On the display substrate, a polarizer (Pol) 210 is disposed in association with the display area.

In some embodiments of the present disclosure, the non-display area may include at least a first portion and a second portion on opposite sides of the display area. As shown in FIGS. 2a and 2b, at a first side of the display area, that is, at a portion (first portion) of the non-display area at the first side of the display area, first connection terminal(s) 211 and first connection hole(s) 2051 penetrating at least the display substrate may be formed. At a second side opposite the first side, that is, at a portion (second portion) of the non-display area at the second side of the display area, second connection terminal(s) 2013 and second connection hole(s) 2053 penetrating at least the display substrate may be formed. The first connection terminal(s) and the second connection terminal(s) may be disposed on the first surface. Herein, the number 205 is used to collectively indicate the connection holes. For example, when referring to "connection hole 205", it may refer to or comprise the first connection holes 2051 and second connection holes 2053 as appropriate. Additionally, in this specification, the term "terminal" is intended to comprise any electrically conductive component suitable for providing or receiving electrical connection, including but not limited to pads, wires, taps, and the like.

Figure 3:
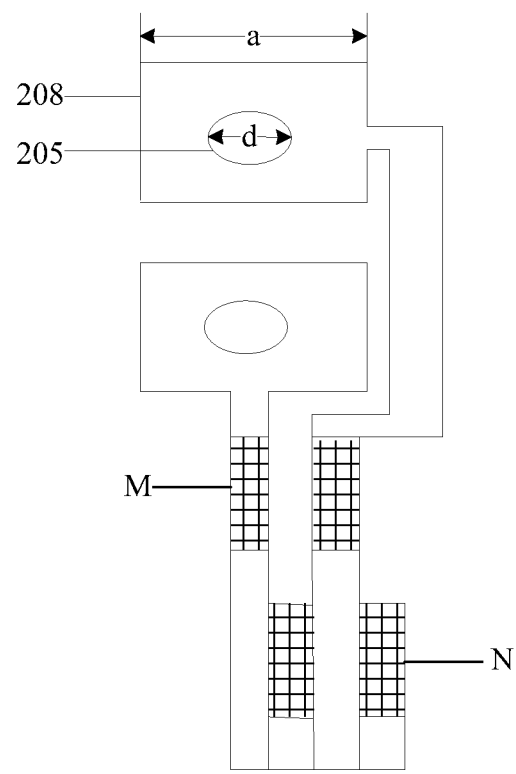
FIG. 3 is a schematic structural view of a connection hole and a connection terminal according to an embodiment of the present disclosure.

Display panel 200 also includes a chip on film assembly (not labeled). The chip on film assembly may include a chip on film 202. The chip on film assembly may further include an integrated circuit chip 204 attached to the chip on film 202. The chip on film 202 may be disposed on a side of the display substrate 201 opposite to the first surface (i.e., on the second surface). The integrated circuit chip 204 may be attached to a side of the chip on film 202 that faces away from the display substrate 201. The chip on film (and correspondingly, the chip on film assembly) may be bonded to the second surface of the display substrate opposite to the first surface with a bonding layer 203. The chip on film 202 may have third connection terminal(s) 208 (as best seen in FIG. 3). There is no limitation on the manner of mechanical coupling and/or electrical connection of the chip on film 202 and the integrated circuit chip 204, and the skilled person in the art can appropriately apply any technique known in the related art or developed in the future as needed.

As shown in the figures, the first and second connection holes can be arranged such that their orthographic projections on the display substrate are within the orthographic projection of the outer edge of the chip on film on the display substrate. In some embodiments, the chip on film can be integrally formed.

According to implementations of the embodiments, the chip on film (COF) can be formed on substantially whole surface of the back side (i.e., the second surface) of the display substrate to accommodate double side punching. In this way, the COF can be made larger, providing sufficient space for the wirings thereon, so that the wirings thereon can be fabricated in a single layer. Conventionally, the COF is usually relatively small, and therefore the wirings thereon usually need to be made into two or more layers, and thus the process is difficult. Therefore, according to the embodiments of the present disclosure, the manufacturing process can be simplified, the manufacturing cost can be reduced, and the design flexibility can be increased.

According to various embodiments, the bonding layer 203 may be formed of various materials. For example, the bonding layer 203 may be an insulating bonding layer formed of insulating material (for example, an insulating bonding material). Alternatively, the bonding layer 203 may be formed of, for example, an anisotropic conductive paste.

In the embodiment shown in FIGS. 2a and 2b, a plurality of connection holes 205 are formed to penetrate through at least the display substrate 201 and the bonding layer 203 at the first side and the opposite second side of the display area, that is, at the first and second portions of the non-display area, respectively. The connection holes 205 are filled with conductive material 206 to form electrical connections (also referred to as vias or via connectors which are also designated with 206). In such an embodiment, the bonding layer 203 may be an insulating bonding layer. Or, in an alternative embodiment, the bonding layer 203 may be formed of an anisotropic conductive paste, for example, in some cases, it may be desirable to provide an electrical connection to the back side of the display substrate through the chip on film.

The connection terminal 211 at the first side and the connection terminal 213 at the second side may be connected to the connection terminals 208 provided on the chip on film 202 through respective conductive materials (e.g., via connectors) 206, respectively.

For high-resolution, a large number of connection terminals may be disposed on the display substrate 201. In the embodiments of the present disclosure, the connection terminals 207 are divided into two parts, which are respectively disposed at the first side and the second side of the display substrate (that is, disposed in the first portion and the second portion of the non-display area). The connection terminals 211 at the first side are connected to the corresponding connection terminals 208 on the chip on film 202 through the conductive materials 206 in the connection holes 205 (2051) at the first side. The connection terminals 213 at the second side are connected to the corresponding connection terminals 208 on the chip on film 202 through the conductive materials 206 in the connection holes 205 (2053) at the second side. Thereby, the number of the connection holes 205 at the first side or the second side is reduced, so that the size at the edge portion of the display panel (which may correspond to the non-display area) can be reduced or minimized, facilitating the design of display panel with arrow bezel. Therefore, a display panel having a narrower bezel can be obtained while ensuring high resolution.

In some embodiments of the present disclosure, as shown in FIGS. 2a and 2b, the connection holes 205 may be configured to penetrate through the display substrate 201 and the bonding layer 203. The connection terminals 208 may be disposed on a side of the chip on film 202 facing the display substrate 201. With such an arrangement, after the connection holes 205 are subsequently filled with a conductive material to form the conductive materials 206, surface contact between the metal materials 206 and the chip on film 202 can be achieved, thereby effectively reducing the contact resistance.

Figure 2C:
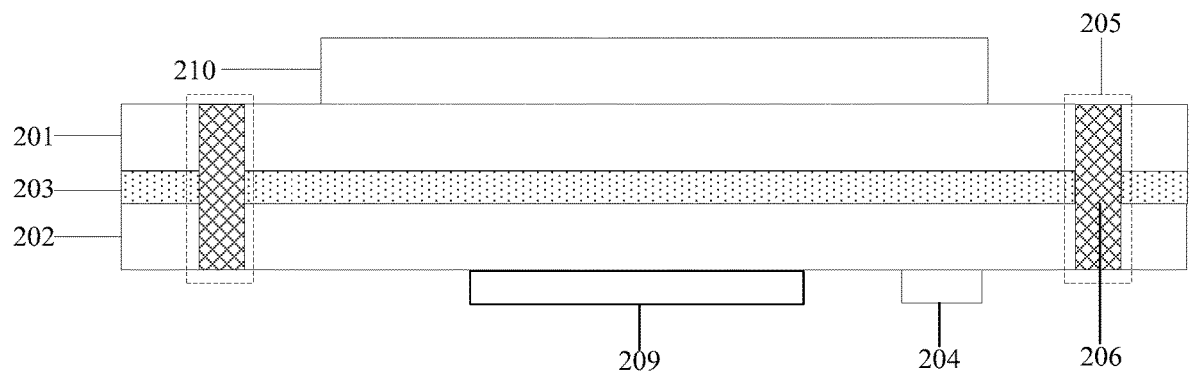
Figure 2D:
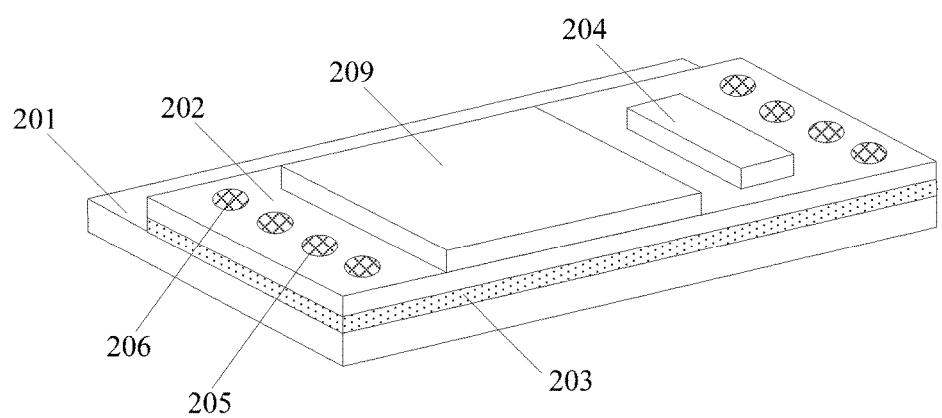

In still other embodiments of the present disclosure, as shown in FIGS. 2c and 2d, the connection holes 205 may be configured to penetrate through the display substrate 201, the bonding layer 203, and the chip on film 202. The connection terminals 208 may be disposed on a side of the chip on film 202 facing away from the display substrate 201. With such an arrangement, in actual operation, after the chip on film 202 is attached to the side of the display substrate 201 facing away from the first surface (i.e., to the second surface), the side where display substrate side 201 is located can be directly placed on an equipment platform to punch from the side of the chip on film 202, thus the display panel can be perforated. In this way, special processing on the equipment platform can be avoided. Further, according to the embodiment, it is also possible to improve the precision of manufacturing, so that a reliable electrical connection can be provided.

For example, in some other embodiments of the present disclosure, a portion of the connection holes 205 may be configured to penetrate through the display substrate 201 and the bonding layer 203, and the connection terminals corresponding to this portion of connection holes 205 may respectively connected to corresponding connection terminals 208 disposed on a side of the chip on film 202 facing the display substrate 201 through the conductive materials 206 in this portion of the connection holes 205. Further, an other portion of the connection holes 205 may be configured to penetrate through the display substrate 201, the bonding layer 203, and the chip on film 202, and the connection terminals corresponding to this other portion of the connection holes are respectively connected to the corresponding connection terminals 208 disposed on the side of the chip on film 202 facing away from the display substrate 201 through the conductive materials 206 in this portion of connection holes 205.

In one example, connection hole(s) penetrating through the display substrate 201 and the bonding layer 203, and connection hole(s) penetrating through the display substrate 201, the bonding layer 203, and the chip on film 202 may be simultaneously present at the first side. Connection holes penetrating through the display substrate 201 and the bonding layer 203, and connection holes penetrating through the display substrate 201, the bonding layer 203, and the chip on film 202 may be simultaneously present at the second side. Obviously, the present disclosure is not limited to this. In this way, design flexibility, such as for component placement and routing, can be increased.

Figure 2E:
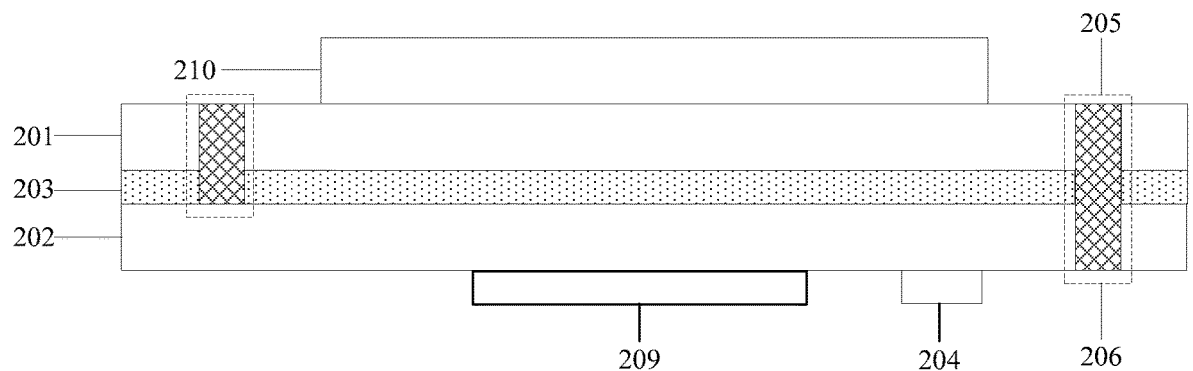
Figure 2F:
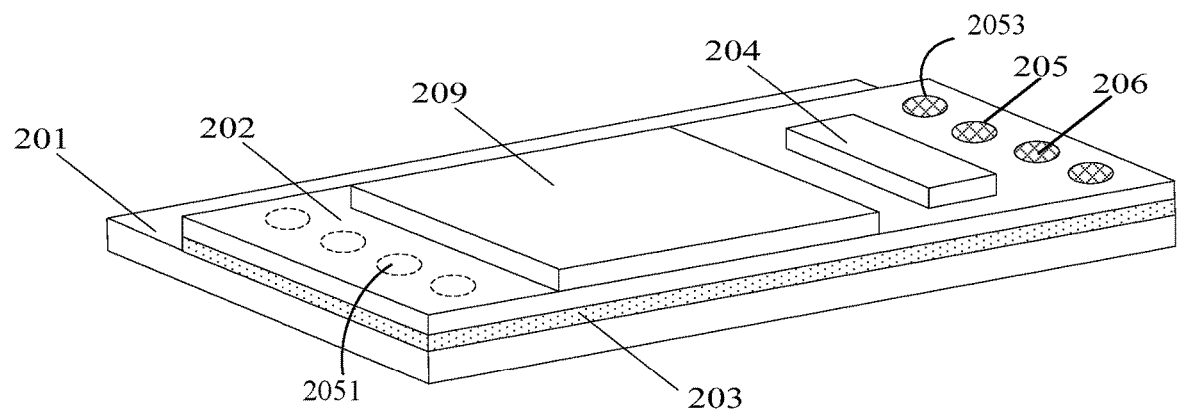
Figure 2G:
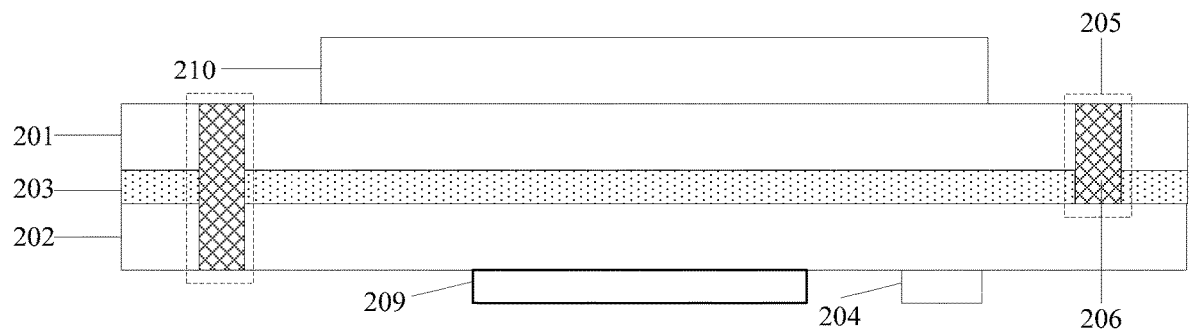
Figure 2H:
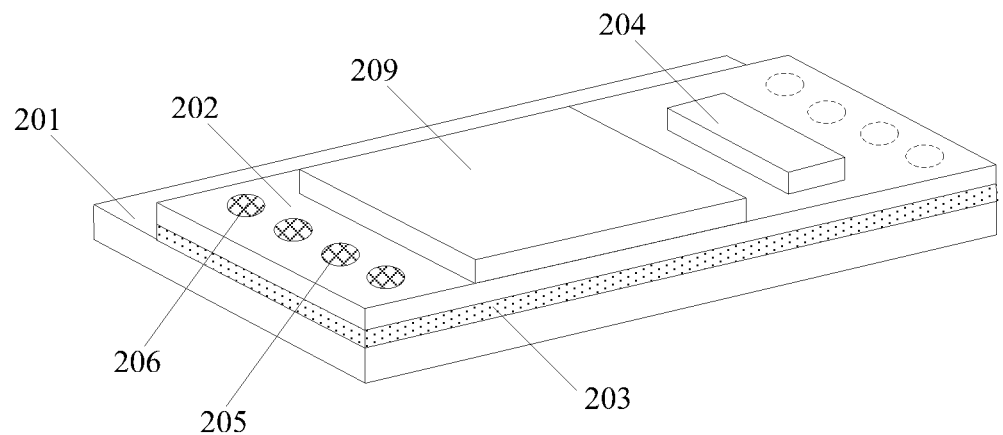

In some other embodiments of the present disclosure, as shown in FIG. 2e and FIG. 2f, it is also possible to have only the connection holes 2051 the display substrate 201 and the bonding layer 203 at the first side, and there are only connection holes 2053 penetrating through the substrate 201, the bonding layer 203, and the chip on film 202 at the second side. In other embodiments, as shown in FIG. 2g and FIG. 2h, only the connection holes 2051 penetrating through the display substrate 201, the bonding layer 203, and the chip on film 202 are present at the first side of the display region, and only the connection holes 2053 penetrating though the display substrate 201 and the bonding layer 203 are present at the second side of the display region. Preferably, the first side and the second side of the display area are in a non-display area on the first surface.

It should be noted that, in practical applications, it is preferable to set the depths of all the connection holes 205 on the display substrate 201 to be the same. For example, each of the connection holes 205 at the first side and each of the connection holes 205 at the second side are configured to penetrate though the display substrate 201 and the bonding layer 203; or the connection holes 205 at the first side and the connection holes 205 at the second side are configured to penetrate through the display substrate 201, the bonding layer 203, and the chip on film 202. Both of these arrangements can make the depths of all the connection holes 205 on the display substrate 201 the same. Therefore, the process parameters can be set only once to form all the connection holes 205, which simplifies the manufacturing process and improves the production efficiency.

Figure 4A:
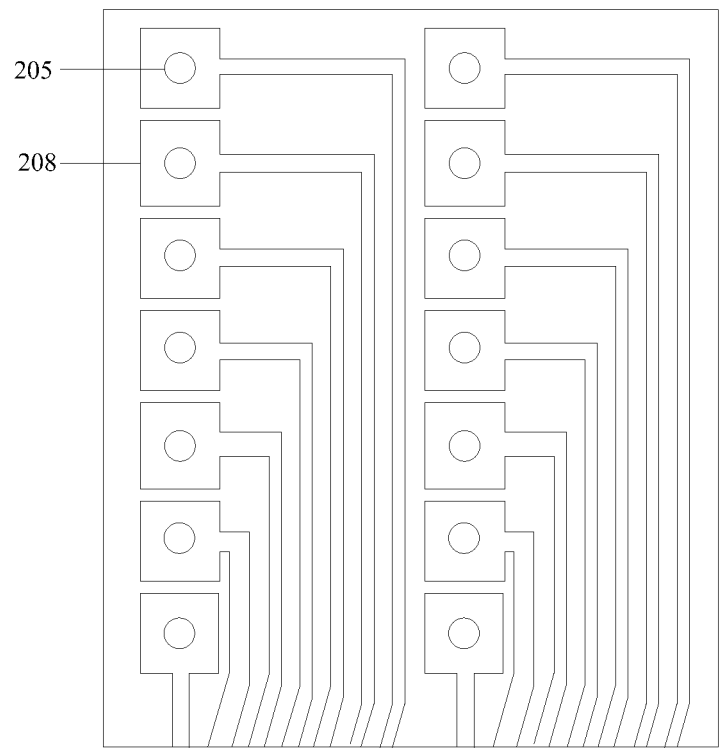
FIGS. 4a and 4b are schematic diagrams showing a connection relationship between a connection terminal of a chip on film and a connection terminal on a display surface of a display substrate and connection holes (or, electrical connection members) according to an embodiment of the present disclosure.
Figure 4B:
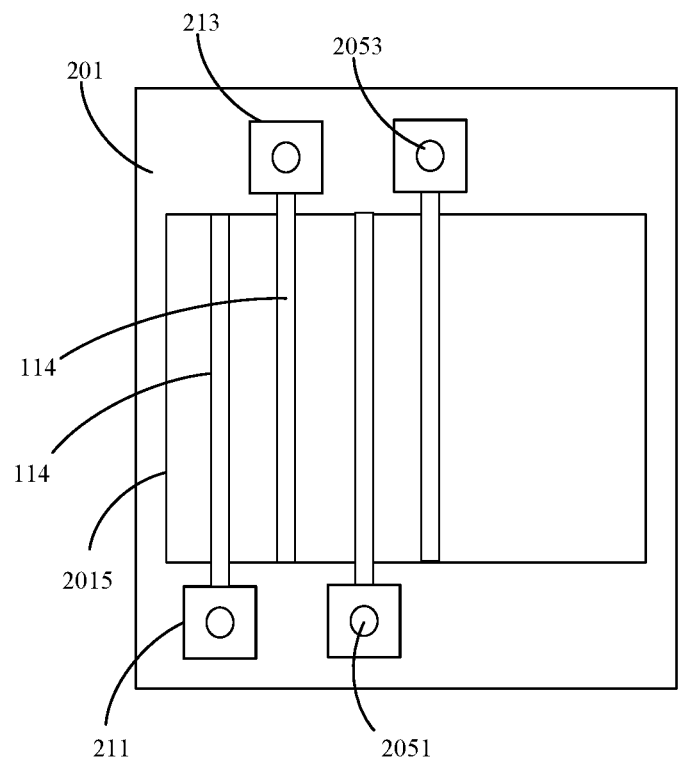

In addition, in some embodiments of the present disclosure, as shown in FIG. 4b, the first connection terminal 211 may be electrically connected to a first wiring 2071 in the display area of the display substrate, and the second connection terminal may be electrically connected to a second wiring 2072 in the display area of the display substrate. The first wirings 2071 and the second wirings 2072 may be alternately arranged.

By such arrangement, the number of the connection terminals at the first side can be made the same as the number of the connection terminals at the second side, so that the number of the connection holes 205 at the first side and the number of the connection holes 205 at the second side are the same, and thus the widths (w) of the first side and the second side can be the same. When being applied to a wearable product such as a wristwatch or a wristband, such display panel having the same width at the first side and at the second side is advantageous to improve the structural stability of the wearable product such as a wristwatch or a wristband.

In some embodiments of the present disclosure, the connection terminal (e.g., the connection terminal 211 at the first side, the connection terminal 213 at the second side) may be used as one or more of a clock connection terminal, a data connection terminal, a high voltage level (VDD) connection terminal, and a low voltage level (VSS) connection terminal. It should be understood that the present disclosure is not limited thereto.

It should be noted that when the connection terminals at the first surface and the connection terminals at the second surface both include the high-level connection terminal and the low-level connection terminal, since the high-level connection terminal and the low-level connection terminal are both routed at the first side and the second side, the phenomenon that brightness of the upper and lower portions of the display panel is not uniform due to the resistor voltage drop (IR drop) of the high-level connection terminal and the low-level connection terminal can be avoided to some extent. Thus, a display of more uniform brightness can be achieved.

In some more specific embodiments, the connection holes 205 are generally arranged to correspond the connection terminals (e.g., the connection terminals 208 and the connection terminals 211 or 213) in one-to-one manner.

FIG. 3 is a schematic structural view of a connection hole and a connection terminal according to an embodiment of the present disclosure. 4a and 4b are schematic views showing the connection relationship between the connection terminals of the chip on film and the connection terminals on the display surface of the display substrate and the connection holes (electrical connectors) according to an embodiment of the present disclosure. As shown in FIGS. 3 and 4a, 4b, the dimension a of the connection terminal 208 is larger than the aperture d of the connection hole 205 (that is, larger than the diameter of the connector in the connection hole); this may also be the case for the connection terminal 211 or 213. In an implementation, the connection terminals are arranged such that their orthographic projections on the display substrate 201 cover the corresponding connection holes 205 so as to provide a reliable electrical connection.

The connection terminals 208 may be correspondingly distributed at both ends of the chip on film 202, and the two ends of the chip on film 202 may respectively correspond to the first side and the second side of the display substrate 201.

It should be noted that, in the above display panels provided by the embodiments of the present disclosure, the connection terminals 208/211/213 may be of any shape, such as a triangle, a square or a circle. When the shape of the connection terminal is a circle, the diameter of the connection terminal is set to be larger than the aperture of the corresponding connection hole 205. When the shape of the connection terminal is square, as shown in FIG. 3, the side length a of the connection terminal is configured to be larger than the aperture d of the connection hole 205. This can be the case for the connection terminals 208/211/213.

Moreover, in some embodiments of the present disclosure, as shown in FIG. 3, the chip on film may also include terminals for connections to the pins of the integrated circuit chip 204 (shown with shaded portions in the figure). In the figure, there is shown a terminal M, which may be disposed in the same layer as the connection terminal 208, connected to a connection terminal 208 with a wire; and a terminal N, which may be disposed in the same layer as the connection terminal 208, or may be set in a different layer from the connection terminal 208, not connected to a connection terminal 208.

Generally, the connection terminals 208 of the chip on film 202 may be large in number and high in density. In order to efficiently and quickly make the connection holes 205 in one-to-one correspondence with the connection terminals 208, in some embodiments of the present disclosure, a laser drilling process may be employed. The connection holes 205 having the desired aperture and hole depth can be obtained by controlling the diameter and energy of the laser. Of course, the connection holes 205 can also be made by other processes known to those skilled in the art.

In some embodiments of the present disclosure, as shown in FIG. 3, the aperture d of each of the connection holes 205 is set to be greater than or equal to 25 μm, that is, the minimum value of the aperture d of each of the connection holes 205 may be 25 μm. The dimensions of the various components at both ends of the display panel (i.e., the first side and the second side of the display area) can be minimized to further achieve a narrow bezel.

In some embodiments of the present disclosure, the conductive material 206 may be formed of a conductive material (e.g., a metal material) having a small electrical resistivity and a good electrical conductivity. Of course, the conductive material 206 can also be other materials having electrical conductivity, such as indium tin oxide, indium zinc oxide, or graphene.

In some embodiments of the present disclosure, the display substrate 201 may be a flexible display substrate or a rigid display substrate. Preferably, the display substrate 201 is a flexible display substrate, such as an Organic Light Emitting Diodes (OLED) display substrate, or a Quantum Dot Light Emitting Diodes (QLED) display substrate, etc.

In some embodiments of the present disclosure, as shown in FIGS. 2b, 2d, 2f, and 2h, the display panel may further include a flexible circuit board 209 attached to a portion of the chip on film. The power, charges, control signals, and the like required for pixel driving in the display panel can be provided by an external flexible printed circuit (FPC). For example, the flexible circuit board 209 may be bonded to a side of the chip on film 202 facing away from the display substrate 201. For example, power and control signals and the like can be transmitted to the display panel, for example, to the terminals 211-213 of the display panel, through the chip on film 202 and the electrical connectors 206. In some embodiments, it is also contemplated that the electrical connection between the flexible circuit board and the display substrate can be provided by the aforementioned electrical connectors or additional electrical connectors.

In some embodiments of the present disclosure, in order to enable better display of the display panel, as shown in FIGS. 2a, 2b, 2c, 2e, and 2g, a polarizer (Pol) 210 may be further included and provided in association with the display area of the first surface of the display substrate 201. The polarizer 210 can be any suitable polarizer known in the art or developed in the future, and can be attached to the display area using any attachment technique known in the art or developed in the future. Here, further detailed description thereof is omitted.

Figure 5A:
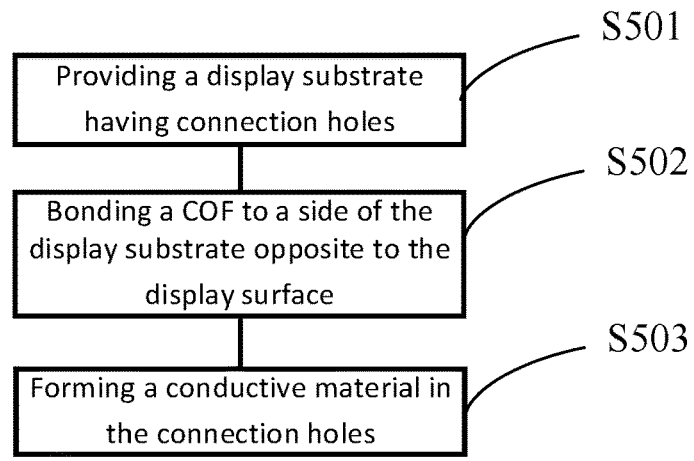
FIGS. 5a and 5b are flowcharts illustrating methods of manufacturing a display panel according to embodiments of the present disclosure.
Figure 5B:
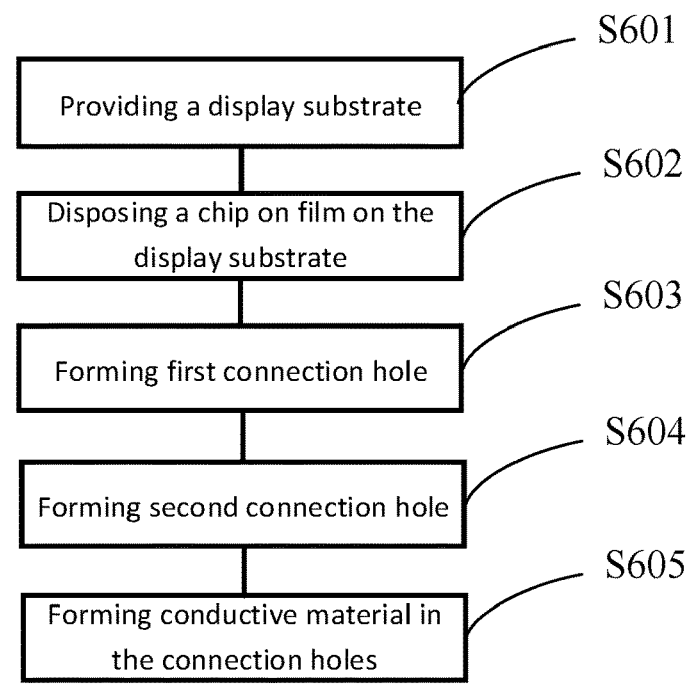

According to some embodiments of the present disclosure, a method of manufacturing a display panel is also provided. FIGS. 5a and 5b respectively illustrate flow charts of methods of manufacturing a display panel in accordance with some embodiments of the present disclosure.

A method of manufacturing a display panel in accordance with some embodiments of the present disclosure is described below in conjunction with FIGS. 5a and 2a, 2b. As shown in FIG. 5a, in step S501, a display substrate 201 is provided. The display substrate 201 may have a first surface 2011 and an opposite second surface 2013. The display substrate 201 may have a display area and a non-display area around the display area. A first connection terminal 211 and a first connection hole 2051 penetrating through at least the display substrate are formed at a first side of the display substrate (i.e., a portion (first portion) of the non-display area at a first side of the display area). A second connection terminal 213 and a second connection hole 2053 penetrating at least through the display substrate is formed at a second side opposite to the first side (i.e., a portion (second portion) of the non-display area at the second side of the display area).

In step S502, a chip on film 202 is bonded to a side (surface 2013) of the display substrate opposite to the first side to bond the chip on film assembly to the display substrate. The chip on film assembly includes the chip on film 202. The chip on film assembly may further include an integrated circuit chip 204. The integrated circuit chip 204 may be disposed on a side of the chip on film that faces away from the display substrate. The chip on film may have a third connection terminal 208.

For example, the chip on film may be attached to the surface 2013 of the display substrate opposite to the first surface 2011 with a bonding layer (e.g., an insulating glue or an anisotropic conductive paste) 203. The bonding layer or a portion thereof herein may be formed of an anisotropic conductive paste. Here, likewise, the first connection hole and the second connection hole may be disposed such that their orthographic projections on the display substrate are within the orthographic projection of the outer edge of the chip on film on the display substrate.

In step S503, a conductive material 206 (such as, but not limited to, a conductive paste) is formed (e.g., filled) in the first and second connection holes to form corresponding electrical connectors (also indicated with 206). The first connection terminal 211 and the second connection terminal 213 may be electrically connected to respective third connection terminals 208 of the chip on film via respective electrical connectors. In such a way, reliable electrical connection between the electrical connector and the corresponding terminal can be provided.

A method of manufacturing a display panel according to further embodiments of the present disclosure is described below with reference to FIGS. 5b and 2c, 2e, 2g. As shown in FIG. 5b, in step S601, a display substrate 201 is provided. The display substrate 201 may have a first surface 2011 and an opposite second surface 2013. The display substrate may have a display area and a non-display area. The non-display area includes at least a first portion and a second portion at opposite sides of the display area. At a first side of the display area, that is, at a portion (first portion) of the non-display area at the first side of the display area, a first connection terminal 211 is formed. At a second side opposite to the first side, that is, at a portion (second portion) of the non-display area at the second side of the display area, a second connection terminal 213 is formed.

In step S602, a chip on film assembly is disposed on the display substrate. The chip on film assembly includes a chip on film. In some implementations, the chip on film assembly can include a chip on film and an integrated circuit chip. In a specific implementation, the chip on film 202 may be disposed on the surface 2013 of the display substrate opposite to the first surface. the integrated circuit chip 204 can be attached to a side of the chip on film that faces away from the display substrate. For example, the chip on film may be attached to the second surface 2013 of the display substrate opposite to the first surface with a bonding layer (e.g., an anisotropic conductive paste) 203.

In step S603, a first connection hole is formed. A first connection hole 2051 may be formed in the first portion of the non-display area, penetrating at least the display substrate.

At step S604, a second connection hole is formed. A second connection hole 2053 penetrating through at least the display substrate may be formed in the second portion of the non-display area. Steps S603 and S604 (that is, formations of the first connection hole and the second connection hole) may be performed simultaneously or separately. According to various embodiments, steps S603 and S604 may also be performed before or after S602.

In step S605, a conductive material 206 is formed in the first and second connection holes. Thereby, corresponding electrical connectors are formed. The first connection terminal and the second connection terminal are respectively electrically connected to respective third connection terminals of the chip on film through respective conductive materials. Here, electrical connection to the display substrate, such as electrical connection between the chip on film (or integrated circuit chip thereon) and the display substrate, may be provided at least via the conductive material(s) (and the above-described terminal(s), etc.). Here, likewise, the first connection hole and the second connection hole may be disposed such that their orthographic projections on the display substrate are within the orthographic projection of the outer edge of the chip on film on the display substrate.

It should be understood that there is no limitation on the order to perform the steps of the method embodiments described above, unless specifically stated otherwise or indicated otherwise by the context expressly or implicitly. For example, according to various embodiments, the steps of forming the connection holes penetrating through the display substrate may be performed before or after bonding the chip on film (or the chip on film assembly). For another example, in the example shown in FIG. 5a, the step of forming a conductive material can be performed before or after the step of disposing the COF assembly.

In a specific implementation, as described above, the forming the first connection hole and the forming the second connection hole may be performed after the chip on film assembly is disposed on the display substrate. In some implementations, forming the conductive material in the first connection hole and the second connection hole may be performed after forming the first connection hole and the second connection hole.

It should also be understood that the chip on film assembly can be provided to the surface of the display substrate opposite the first surface in a variety of implementation manners. For example, an integrated circuit chip may be provided on the chip on film; thereafter, the chip on film is attached to a side (surface) of the display substrate facing away from the first surface, for example, with a conductive paste. However, the manner in which the chip on film assembly is disposed to the display substrate is not limited thereto, as long as the integrated circuit chip is finally attached to the chip on film and the chip on film is attached to the display substrate.

In other embodiments of the present disclosure, a plurality of connection holes penetrating through at least the display substrate and the bonding layer are respectively formed at the first side and the second side opposite to the first side of the first surface, which may be implemented by the following step: forming a plurality of connection holes penetrating through the display substrate and the bonding layer at a first side of the first surface and a second side of the first surface opposite to the first side, respectively, such that the connection terminals at the first side and the connection terminals at the second side are respectively connected to the connection terminals provided on the side of the chip on film facing the display substrate with a conductive material.

In other embodiments of the present disclosure, a plurality of connection holes penetrating through at least the display substrate and the bonding layer are respectively formed at the first side and the second side opposite to the first side of the first surface, which can also be implemented by the following step: forming a plurality of connection holes penetrating through the display substrate, the bonding layer, and the chip on film at a first side of the first surface and a second side opposite to the first side of the first surface, such that the connection terminals at the first side and the connection terminals at the second side are respectively connected to the connection terminals disposed on a side of the chip on film facing away from the display substrate with a conductive material.

In other embodiments of the present disclosure, forming a plurality of connection holes penetrating through at least the display substrate and the bonding layer respectively at the first side of the first surface and the second side of the first surface opposite to the first side can be implemented with following steps:

Forming a part of the connection holes, which penetrate through the display substrate and the bonding layer, at a first side of the first surface and a second side of the first surface opposite to the first side, respectively, such that the connection terminals at the first side and the connection terminals at the second side are connected to the connection terminals disposed on the side of the chip on film facing the display substrate with conductive materials in the part of the connection holes; and forming a remaining part of the connection holes, which penetrate through the display substrate, the bonding layer, and the chip on film, at a first side of the first surface and a second side of the first surface opposite to the first side, such that the connection terminals at the first side and the connection terminals at the second side are respectively connected to the connection terminals disposed on the side of the chip on film facing away from the display substrate through the conductive materials in the remaining part of the connecting holes.

In a further embodiment of the present disclosure, forming a plurality of connection holes penetrating through at least the display substrate and the bonding layer respectively at the first side of the first surface and the second side of the first surface opposite to the first side may also be achieved as follows:

Forming a plurality of connection holes penetrating the display substrate and the bonding layer at the first side of the first surface such that the connection terminals at the first side are connected to the connection terminals disposed on the chip on film facing the display substrate with the conductive material; and forming a plurality of connection holes penetrating through the display substrate, the bonding layer and the chip on film at a second side of the first surface opposite to the first side, such that the connection terminals at the second side are connected to the connection terminals provided on the chip on film facing away from the display substrate with a conductive material; or Forming a plurality of connection holes penetrating the display substrate, the bonding layer, and the chip on film at the first side of the first surface such that the connection terminals at the first side are connected to the connection terminals disposed on the chip on film facing away from the display substrate with a conductive material; and forming a plurality of connection holes penetrating through the display substrate and the bonding layer at a second side of the first side opposite to the first side, such that the connection terminals at the second side are connected to the connection terminals provided on the chip on film facing the display substrate.

According to some embodiments of the present disclosure, at least one connection hole of the first connection holes and the second connection holes and a conductive material corresponding to the at least one connection hole may be configured to penetrate through the display substrate and the bonding layer. A third connection terminal corresponding to the at least one connection hole may be disposed on a side of the chip on film that faces the display substrate.

According to some embodiments of the present disclosure, at least one connection hole of the first connection holes and the second connection holes and a conductive material corresponding to the at least one connection hole may be configured to penetrate through the display substrate, the bonding layer, and the chip on film. A third connection terminal corresponding to the at least one connection hole may be disposed on a side of the chip on film that faces away from the display substrate.

According to some embodiments of the present disclosure, the first connection holes may be in one-to-one correspondence with the first connection terminals. The second connection holes may have a one-to-one correspondence with the second connection terminals. Each of the first and second connection terminals may have a size larger than a diameter of the corresponding connection hole. An orthographic projection of each of the first and second connection terminals on the display substrate may be configured to cover a corresponding connection hole.

According to some embodiments of the present disclosure, the method further includes a step of: bonding a flexible circuit board to the chip on film on a side of the chip on film on which the integrated circuit chip is disposed.

In order to improve production efficiency, the flexible circuit board may be bonded to the side of the chip on film on which the integrated circuit chip is to be disposed while the integrated circuit chip is disposed on the chip on film. Of course, the step of bonding the flexible circuit board on the side of the chip on film on which the integrated circuit chip is to be provided may be performed before or after the integrated circuit chip is disposed on the chip on film.

According to some embodiments of the present disclosure, the chip on film may be bonded to the second surface of the display substrate with a bonding layer, such as but not limited to, an anisotropic conductive paste. In some embodiments, a part of the connection holes (e.g., the first connection holes) and electrical connectors corresponding thereto can be configured to penetrate through the display substrate and the bonding layer. In such a case, the third connection terminals corresponding to said connection holes may be disposed on a side of the chip on film that faces the display substrate.

In some embodiments, a part of connection holes (e.g., the second connection holes) and the electrical connectors corresponding thereto penetrate through the display substrate, the bonding layer, and the chip on film. In such a case, the third connection terminals corresponding to said connection holes may be disposed on a side of the chip on film that faces away from the display substrate. In some embodiments, the chip on film can be integral.

In some embodiments, the method may further comprise: bonding a flexible circuit board to the chip on film on a side of the chip on film that is provided with the integrated circuit chip.

Figure 7:
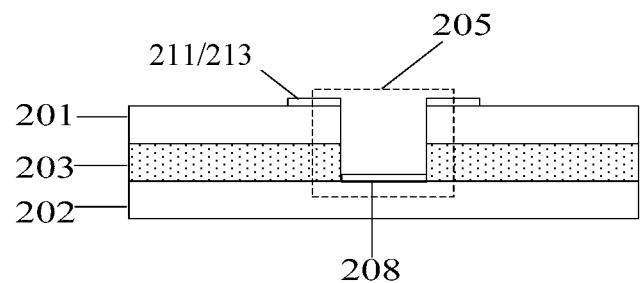
FIG. 7 is a schematic cross-sectional view of the display panel of FIG. 6d along the line AA.
Figure 8:
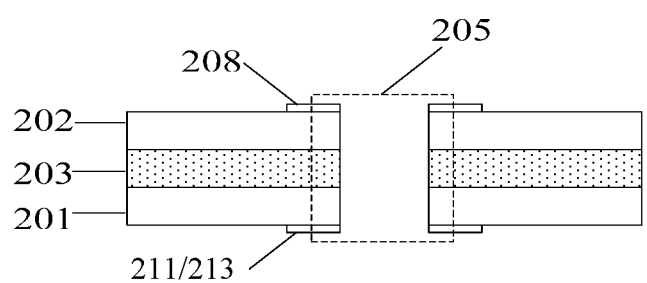
FIG. 8 is a cross-sectional view of the display panel of FIG. 6e along the line BB.

FIGS. 6a to 6e respectively illustrate structural diagrams of a display panel corresponding to some steps in a method of manufacturing a display panel according to some embodiments of the present disclosure. FIG. 7 is a schematic cross-sectional view of the display panel of FIG. 6d taken along line AA. FIG. 8 is a cross-sectional view of the display panel of FIG. 6e taken along line BB. A method of manufacturing a display panel in accordance with some embodiments of the present disclosure is described below in conjunction with FIGS. 6a-6e, 7-8, and 2a-2d.

Figure 6A:
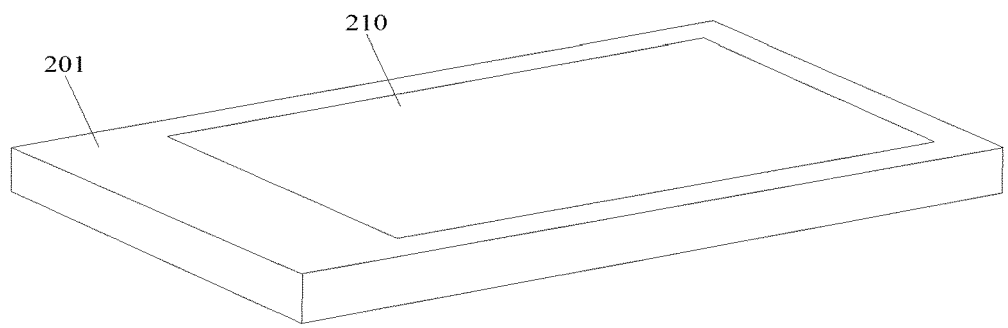
FIG. 6a to 6e are schematic structural diagrams of a display panel corresponding to the steps in a method for manufacturing the display panel according to an embodiment of the present disclosure.

As shown in FIG. 6a, a display substrate 201 is provided. A polarizer 210 may be attached to a display area of the display substrate 201. At a first side of the first surface, that is, at a portion (first portion) of the non-display area at the first side of the display area, first connection terminal(s) may be formed. At a second side opposite the first side, that is, at a portion (second portion) of the non-display area at the second side of the display area, second connection terminal(s) is formed.

Figure 6B:
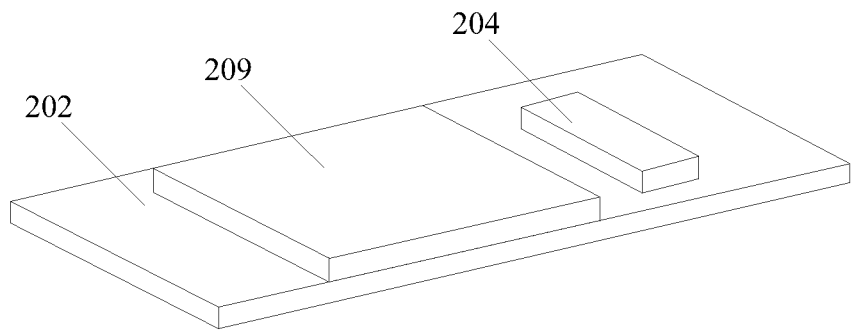

As shown in FIG. 6b, a chip on film assembly is provided. The chip on film assembly may include a chip on film 202. In some examples, the chip on film assembly can further include an integrated circuit chip 204. For example, an integrated circuit chip 204 can be disposed on the chip on film 202. Alternatively, a flexible circuit board 209 may also be bonded (attached) to the side of the chip on film 202 on which the integrated circuit chip 204 is to be disposed. The chip on film 202 can have one or more connection terminals 208. The connection terminals 208 may be disposed on different surfaces or different layers of the chip on film 202 according to different needs.

Figure 6C:
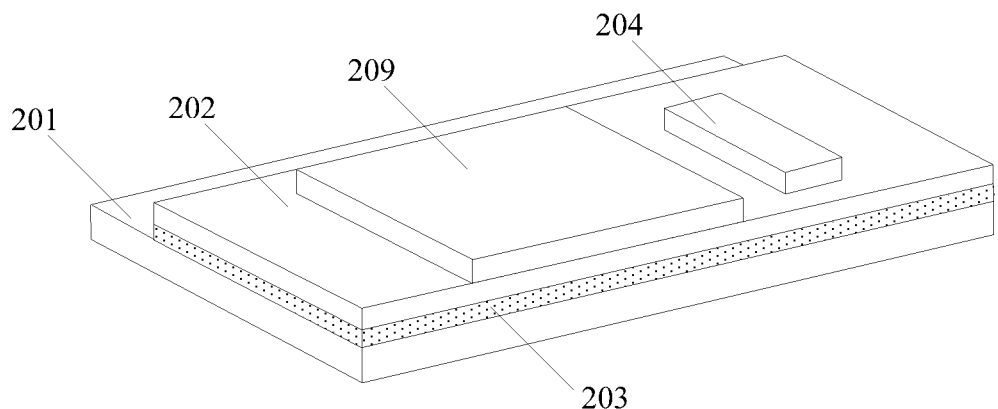

As shown in FIG. 6c, the chip on film 202 is bonded to the side of the display substrate 201 facing away from the first side (i.e., to the second side), for example, with a bonding layer 203. The integrated circuit chip 204 may be disposed on a side of the chip on film 202 facing away from the display substrate 201.

Figure 6D:
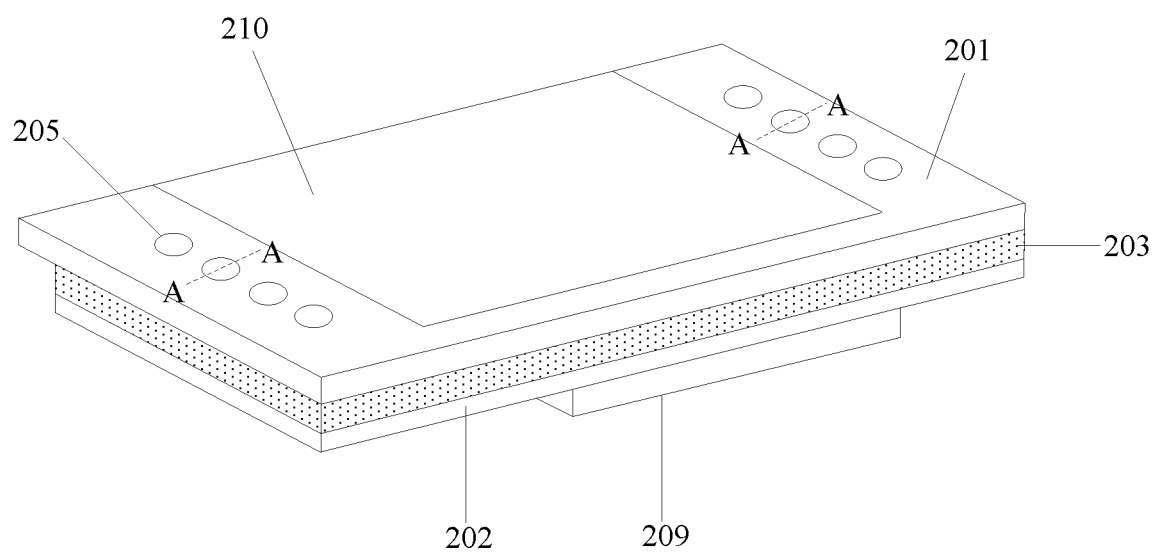

As shown in FIG. 6d and FIG. 7, punching may be performed from the side of the first surface of the display substrate 201 by, for example, a laser puncturing process, to form a plurality of connection holes 2051 and 2053 penetrating through the display substrate 201 and the bonding layer 203 at the first side of the first surface (i.e., in a portion (first portion) of the non-display area at the first side of the display area) and a second side opposite to the first side (i.e., in a portion (second portion) of the non-display area at the second side of the display area). FIG. 7 schematically show the connection terminal portions 211/213 and the connection terminals 208 on the chip on film remained after punching process.

Each of the connection holes may be arranged such that its orthographic projection on the display substrate is located within the orthographic projection of the outer edge of the chip on film on the display substrate. The connection holes 205 may correspond to the connection terminals 208 on a side of the chip on film 202 facing the display substrate 201 in one-to-one manner, and may correspond to the connection terminals 211/213 on the first surface of the display substrate, respectively. The size of the connection terminal 208/211/213 may be set to be larger than the apertures of the connection holes 205. The connection terminal 208/211/213 may be disposed such that the orthographic projection thereof on the display substrate 201 covers the corresponding connection hole 205.

Thereafter, a conductive material may be filled in the connection holes 205 to form the conductive materials 206 such that the connection terminal(s) 211 at the first side and the connection terminal(s) 213 at the second side are connected to the connection terminals 208 on the chip on film 202 through the conductive materials 206, as shown in FIGS. 2a and 2b.

So far, a display panel having the structure shown in FIGS. 2a and 2b has been produced.

Figure 6E:
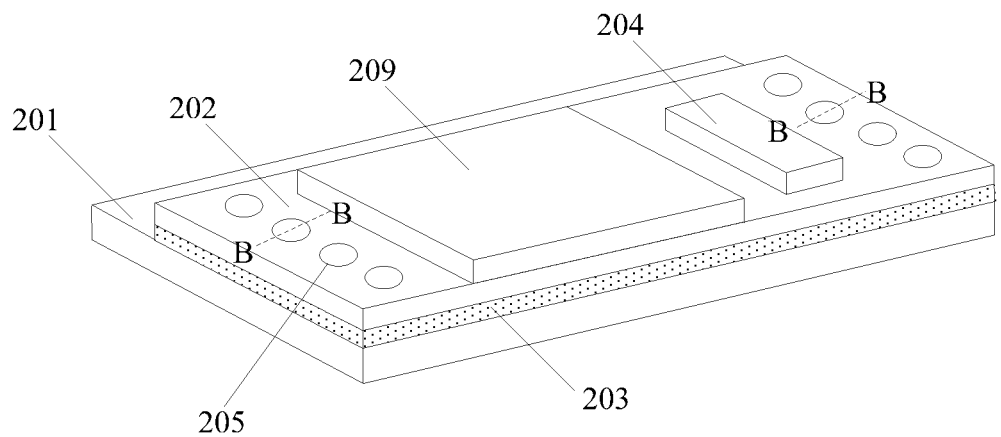

The detailed process of producing the display panel as shown in FIGS. 2c and 2d is similar to the detailed process of manufacturing the display panel shown in FIGS. 2a and 2b, with a difference mainly in the steps of forming the connection holes 205 and the position setting of the connection terminals 208. FIGS. 6e and 8 show schematic structures as an alternative implementation of the connection hole forming step of FIG. 6d. The steps before FIG. 6e can be substantially the same as those shown in FIGS. 6a-6c. Therefore, only the differences between the display panel shown in FIG. 2c and FIG. 2d and the display panel shown in FIG. 2a and FIG. 2b are described here, and the repeated description thereof will be omitted.

According to the alternative implementation, a laser drilling process may be performed from a side of the display substrate 201 facing away from the first surface, that is, from the side of the chip on film, to form a plurality of connection holes 205 which penetrate through the chip on film 202, the bonding layer 203, and the display substrate 201, at the first side and a second side opposite to the first side of the display area (i.e., the first portion and the second portion of the non-display area) respectively, as shown in FIGS. 6e and 8.

In some embodiments, the connection holes 205 may be configured in a one-to-one correspondence with the connection terminals 208 at a side of the chip on film 20 facing away from the display substrate 201. The connection terminals 208 may have sizes larger than the apertures of the respective connection holes 205. The orthographic projections of the connection terminals 208 on the display substrate 201 cover the respective connection holes 205. Similarly, for the connection terminals 211/213, such a configuration can also be applied.

Thereafter, a conductive material may be filled in the connection holes 205 to form the conductive materials 206 such that the connection terminal(s) 211 at the first side and the connection terminal(s) 213 at the second side are connected to the connection terminals 208 on the chip on film 202 through the conductive material 206, as shown in FIGS. 2c and 2d.

The display panel according to the embodiments of the present disclosure can be applied to a wide variety of display devices including, but not limited to, any product or component that has a display function, such as mobile phones, tablet computers, television sets, displays, notebook computers, digital photo frames, navigators, smart watches, fitness wristbands, individual digital assistant, or the like. The display devices can be implemented with reference to the embodiments of display panels as above, and thus repeated description thereof is herein omitted.

According to the embodiments of the present disclosure, the terminal bending process is omitted, so that the terminal bending region does not exist at the edge of the display panel, thereby making the frame of the display panel narrower.

According to the embodiments of the present disclosure, the number of connection holes at the first side or the second side is reduced, achieving a narrow bezel design of the display panel. Therefore, a display panel having a narrower bezel is obtained while ensuring high resolution.

According to the embodiments of the present disclosure, the substrate utilization efficiency can be improved, the yield can be improved, the manufacturing process can be simplified, and/or the manufacturing cost can be reduced.

It will be apparent to those skilled in the art that various changes and modifications can be made in the present disclosure without departing from the spirit and scope of the disclosure. The features of the embodiments disclosed herein may be freely combined as appropriate without departing from the spirit and scope of present disclosure. Therefore, any modifications and variations of present disclosure that fall within the scopes of the appended claims and equivalents thereof are intended to be embraced by the present disclosure. The scopes of inventions shall be defined by the appended claims.

What is claimed is:

1. A display panel comprising:
a display substrate having a first surface and a second surface opposite to the first surface, the display substrate having a display area and a non-display area, the non-display area including at least a first portion and a second portion located on two opposite sides of the display area;
a first connection terminal located at the first portion and located on the first surface;
a first connection hole located at the first portion, the first connection hole at least penetrating the display substrate;
a second connection terminal located at the second portion and located on the first surface;
a second connection hole located at the second portion, and the second connection hole at least penetrating the display substrate;
a chip on film (COF) located on a second surface of the display substrate, the chip on film including third connection terminals; and
conductive materials respectively disposed in the first connection hole and the second connection hole;
wherein the first connection terminal and the second connection terminal of the display substrate are electrically connected to the respective third connection terminals through the conductive materials located in the first connection hole and the second connection hole, respectively; and
wherein orthographic projections of the first connection hole and the second connection hole on the display substrate is located within an orthographic projection of an outer edge of the chip on film on the display substrate.

2. The display panel of claim 1, further comprising:
a bonding layer disposed between the chip on film and the second surface of the display substrate.

3. The display panel of claim 2,
wherein at least one of the first connection hole and the second connection hole and the conductive material corresponding to the at least one of the first connection hole and the second connection hole penetrate the display substrate and the bonding layer; and
wherein the third connection terminal corresponding to the at least one of the first connection hole and the second connection hole is disposed on a side of the chip on film which faces the display substrate.

4. The display panel according to claim 2,
wherein at least one of the first connection hole and the second connection hole and the conductive material corresponding to the at least one of the first connection hole and the second connection hole penetrate the display substrate, the bonding a layer and the chip on film; and
wherein the third connection terminal corresponding to the at least one of the first connection hole and the second connection hole is disposed on a side of the chip on film which faces away from the display substrate.

5. The display panel according to claim 1, wherein the first connection terminal is electrically connected to a first wiring in the display area of the display substrate, and the second connection terminal is electrically connected to a second wiring in the display area of the display substrate, and the first wiring and the second wiring are alternately arranged.

6. The display panel of claim 1, wherein the display panel comprises a plurality of the first connection holes, a plurality of the first connection terminals, a plurality of the second connection holes, and a plurality of the second connection terminals,
the plurality of the first connection holes are in one-to-one correspondence with the plurality of the first connection terminals,
the plurality of the second connection holes are in one-to-one correspondence with the plurality of the second connection terminals, and
the sizes of the plurality of the first connection terminals and the plurality of the second connection terminals are larger than sizes of the respective plurality of the first connection holes and the plurality of the second connection holes.

7. The display panel of claim 1, wherein:
the first connection hole and the second connection hole have a diameter greater than or equal to 25 μm; and
orthographic projections of the first connection terminal and the second connection terminal on the display substrate cover orthographic projections of respective connection holes on the display substrate.

8. The display panel of claim 1, wherein the first connection terminal or the second connection terminal is adapted to function as one or more of the following: a clock connection terminal, a data connection terminal, a high level connection terminal, a low level connection terminal.

9. The display panel of claim 1, further comprising:
an integrated circuit chip on a side of the chip on film facing away from the display substrate; and
a flexible circuit board bonded to the chip on film on a side of the chip on film which faces away from the display substrate.

10. The display panel of claim 1, wherein the display substrate is a flexible display substrate.

11. A display device comprising the display panel according to claim 1.

12. A method of manufacturing a display panel, comprising:
providing a display substrate having a first surface and a second surface opposite to the first surface, the display substrate having a display area and a non-display area, the non-display area including at least a first portion and a second portion on opposite sides of the display area, the display substrate having a first connection terminal at the first portion of the non-display area and on the first surface, and a second connection terminal at the second portion of the non-display area and on the first surface;
providing a chip on film assembly on the display substrate, the chip on film assembly comprising a chip on film, wherein the chip on film is bonded to a second surface of the display substrate, the chip on film having a third connection terminal;
forming a first connection hole in the first portion of the non-display area, the first connection hole at least penetrating the display substrate;
forming a second connection hole in the second portion of the non-display area, the second connection hole extending at least through the display substrate;
forming a conductive material in the first connection hole and the second connection hole,
wherein the first connection terminal and the second connection terminal are respectively electrically connected to corresponding third connection terminals of the chip on film via respective conductive material, and
wherein the first connection hole and the second connection hole are configured such that orthographic projections thereof on the display substrate are within an orthographic projection of an outer edge of the chip on film on the display substrate.

13. The method of claim 12, wherein providing the chip on film assembly on the display substrate comprises:
bonding the chip on film to the second surface of the display substrate with a bonding layer.

14. The method of claim 13, wherein:
at least one of the first connection hole and the second connection hole is formed to penetrate the display substrate and the bonding layer,
the conductive material corresponding to the at least one of the first connection hole and the second connection hole is also formed to penetrate the display substrate and the bonding layer, and
the third connection terminal corresponding to the at least one of the first connection hole and the second connection hole is disposed on a side of the chip on film which faces the display substrate.

15. The method of claim 13, wherein:
at least one of the first connection hole and the second connection hole is formed to penetrate through the display substrate, the bonding layer, and the chip on film,
the conductive material corresponding to the at least one of the first connection hole and the second connection hole penetrates the display substrate, the bonding layer, and the chip on film, and
the third connection terminal corresponding to the at least one of the first connection hole and the second connection hole is disposed on a side of the chip on film which faces away from the display substrate.

16. The method of claim 12,
wherein the display substrate has a plurality of the first connection terminals at the first portion of the non-display area and on the first surface, and a plurality of the second connection terminals at the second portion of the non-display area and on the first surface;
wherein forming a first connection hole in the first portion of the non-display area comprises forming a plurality of the first connection holes in the first portion of the non-display area;
wherein forming a second connection hole in the second portion of the non-display area comprises forming a plurality of the second connection holes in the second portion of the non-display area;
wherein forming a conductive material in the first connection hole and the second connection hole comprises forming a conductive material in the plurality of the first connection holes and the plurality of the second connection holes; and
wherein:
the plurality of the first connection holes are in one-to-one correspondence with the plurality of the first connection terminals,
the plurality of the second connection holes are in one-to-one correspondence with the plurality of the second connection terminals, and
an orthographic projection of each of the plurality of the first connection terminals on the display substrate covers a corresponding one of the plurality of the first connection holes, and
an orthographic projection of each of the plurality of the second connection terminals on the display substrate covers a corresponding one of the plurality of the second connection holes.

17. The method according to claim 12, wherein forming the first connection hole and forming the second connection hole are performed by a laser drilling process.

18. The method of claim 12 further comprising:
bonding a flexible circuit board to the chip on film on a side of the chip on film which is provided with an integrated circuit chip.

19. The method of claim 12, wherein the chip on film assembly further comprises an integrated circuit chip disposed on a side of the chip on film which faces away from the display substrate.

20. The method of claim 12, wherein:
after the chip on film assembly is disposed on the display substrate, forming the first connection hole and the forming the second connection hole are performed; and
forming of the conductive material in the first connection hole and the second connection hole is performed after the first connection hole and the second connection hole are formed.

* * * * *